(12) United States Patent
Fujiwara et al.

(10) Patent No.: US 7,754,803 B2
(45) Date of Patent: Jul. 13, 2010

(54) RESIN COMPOSITION

(75) Inventors: Akihiko Fujiwara, Izumi (JP); Koichi Shibayama, Kawanishi (JP); Hidenobu Deguchi, Takatsuki (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 10/503,491

(22) PCT Filed: Feb. 4, 2003

(86) PCT No.: PCT/JP03/01089

§ 371 (c)(1),
(2), (4) Date: Aug. 5, 2004

(87) PCT Pub. No.: WO03/066740

PCT Pub. Date: Aug. 14, 2003

(65) Prior Publication Data

US 2005/0165151 A1 Jul. 28, 2005

(30) Foreign Application Priority Data

| Feb. 6, 2002 | (JP) | ............................ 2002-029783 |
| May 14, 2002 | (JP) | ............................ 2002-139090 |
| May 30, 2002 | (JP) | ............................ 2002-158210 |
| Sep. 30, 2002 | (JP) | ............................ 2002-287005 |

(51) Int. Cl.
C08K 3/34 (2006.01)
C08K 5/98 (2006.01)
C08L 67/02 (2006.01)
C08J 5/18 (2006.01)
C08K 5/50 (2006.01)
H05K 1/03 (2006.01)

(52) U.S. Cl. .................. 524/449; 524/443; 524/444; 524/445; 524/446; 524/447; 524/448; 524/399; 523/216; 523/461

(58) Field of Classification Search ................. 524/449, 524/445–448; 523/216, 461
See application file for complete search history.

(56) References Cited

U.S. PATENT DOCUMENTS

| 4,810,734 | A | * | 3/1989 | Kawasumi et al. ........... 523/216 |
| 4,889,885 | A | * | 12/1989 | Usuki et al. ................ 524/445 |
| 6,610,770 | B1 | * | 8/2003 | Ross et al. ................. 524/445 |
| 6,815,485 | B2 | * | 11/2004 | Kamo ........................ 524/399 |

FOREIGN PATENT DOCUMENTS

| CA | 2429683 | 6/2002 |
| JP | 63-221168 | 9/1988 |
| JP | 63-242915 | 10/1988 |
| JP | 06-107958 | 4/1994 |
| JP | 11-349709 | * 12/1999 |
| JP | 11-349709 A | 12/1999 |
| JP | 2001-019834 | 1/2001 |
| JP | 11-323167 A | 11/2001 |
| JP | 2001-329180 | * 11/2001 |
| JP | 02-16479 A1 | 2/2002 |
| JP | 2002-302583 | 10/2002 |
| JP | 2002-363386 | 12/2002 |
| JP | 2002-363387 | 12/2002 |
| JP | 2004-176031 | 6/2004 |
| KR | 1993-2983 A | 4/1993 |
| WO | 93/04117 A1 | 3/1993 |
| WO | WO 98/45741 A1 | 10/1998 |
| WO | WO 00/34378 A | 6/2000 |
| WO | WO 01/63984 A | 8/2001 |
| WO | WO 01/63984 A1 | * 8/2001 |
| WO | WO 01/63984 A1 | * 8/2001 |
| WO | 02-46312 A1 | 6/2002 |

OTHER PUBLICATIONS

Hitachi Technical Report No. 37 (Jul. 2001) pp. 7-16 entitled "Trend In Optical Fiber Communications Technology And The Expected Role of Materials and Components in Developing FTTH".
JP 2000-183539 A, filed Dec. 18, 1999, & English Abstract thereof.
JP 11-60983 A, & English Abstract thereof, publication dated Mar. 5, 1999.
Database WPI, Derwent Publications, Ltd., London, GB; AN 2000-572718 & CN 1258 690 A (Univ Zhejiang), Jul. 5, 2000—Abstract.
Database EPODOC, European Patent Office, The Hague,NL; XP002382190, Abstract, & TW 464 668 B (Wei, Guant-Hua), Nov. 21, 2001, Abstract.
JP 11-207868 A, & English Abstract thereof, publication date Aug. 3, 1999.
JP 11-255864 A, & English Abstract thereof, publication date Sep. 21, 1999.
JP 2001-115037 A, & English Abstract thereof, publication date Apr. 24, 2001.
JP 09-77973 A, & English Abstract thereof, publication date Mar. 25, 1997.
JP 05-169528 A, & English Abstract thereof, publication date Jul. 9, 1993.
JP 10-007898 A, & English Abstract thereof, publication date Jan. 13, 1998.
JP 10-076563 A, & English Abstract thereof, publication date Mar. 24, 1998.

(Continued)

*Primary Examiner*—Duane Smith
*Assistant Examiner*—Ives Wu
(74) *Attorney, Agent, or Firm*—Townsend & Banta

(57) ABSTRACT

A resin composition, substrate material, sheet, laminated board, resin-bearing copper foil, copper-clad laminate, TAB tape, printed circuit board, prepreg and adhesive sheet are provided which exhibit improved physical properties, dimensional stability, heat resistance and flame retardance, particularly high-temperature physical properties. A resin composition containing 100 parts by weight of a thermoplastic resin and 0.1-65 parts by weight of an inorganic compound, the resin composition having a mean linear expansion coefficient ($\alpha 2$) of $1.0 \times 10^{-3}$ [° C.$^{-1}$] or below over the temperature range from a temperature 10° C. higher than a glass transition temperature of the resin composition to a temperature 50° C. higher than the glass transition temperature of the resin composition.

31 Claims, No Drawings

OTHER PUBLICATIONS

JP 2000-169689 A, & English Abstract thereof, publication date Jun. 20, 2000.
JP 2000-212294 A, & English Abstract thereof, publication date Aug. 2, 2000.
JP 2001-302888 A, & English Abstract thereof, publication date Oct. 31, 2001.
JP 2001-302888 A, & English Abstract thereof, publication date Nov. 20, 2001.

* cited by examiner

RESIN COMPOSITION

TECHNICAL FIELD

The present invention relates to a resin composition, substrate material, sheet, laminated board, resin-bearing copper foil, copper-clad laminate, TAB tape, printed circuit board, prepreg, adhesive sheet and optical circuit forming material, which exhibit improved physical properties, dimensional stability, heat resistance and flame retardance, particularly high-temperature physical properties.

BACKGROUND ART

As recent technology continues to rapidly increase performance, operation and compactness levels of electronic devices, there is an increasing demand to further reduce sizes and weights of electronic parts for use in electronic devices. This also demands to further improve properties, e.g., heat resistance, mechanical strength and electrical properties of electronic part materials. For example, high levels of density, operation and performance are required for methods of packaging semiconductor devices and for wiring boards mounting such semiconductor devices.

A multilayer printed circuit board generally includes plural layers of insulating substrates. For these interlayer insulating substrates, thermosetting resin prepregs including thermosetting resins impregnated in a glass cloth and films composed of thermosetting resins or photosetting resins have been conventionally used, for example. It is to be desired that the multilayer printed circuit board has a considerably narrow interlayer spacing to increase its density as well as reduce its thickness. This raises a need for an interlayer insulating substrate either with or without a thin glass cloth. Examples of materials known to constitute such an interlayer insulating substrate include rubbers (elastomers), thermosetting resins modified with acrylic resins or others, thermoplastic resins incorporating a large amount of inorganic fillers and the like. In Japanese Patent Laying-Open No. 2000-183539, a method is disclosed for manufacturing a multilayer insulating substrate by incorporating an inorganic filler having a specific range of particle diameters into a varnish comprised chiefly of a high-molecular epoxy polymer and a polyfunctional epoxy resin and coating the resultant onto a substrate to form an insulating layer thereon.

However, the multilayer insulating substrate made by the above-specified manufacturing method must incorporate a large amount of inorganic filler in order to insure a sufficient interfacial contact area between the inorganic filler and the high-molecular epoxy polymer or polyfunctional epoxy resin to improve mechanical strength and other physical properties. This in some cases adds to manufacturing process steps or other inconveniences from the processing point of view and in other cases results in the difficulty to reduce an interlayer spacing, which have been problems.

The thin interlayer insulating substrate, either with or without a thin glass cloth, shows insufficient heat resistance and dimensional stability and often causes inconveniences during a manufacturing process because it is brittle and easy to break, which have been problems.

The multilayer printed circuit board is fabricated such as by a buildup method wherein a sequence of forming a circuit on a layer and superimposing another layer on the circuit is repeated to build up a laminated board, or by a single-operation stacking method wherein circuit-formed layers are stacked together in a single operation. Due to the increased number of processes in either fabrication method, the quality of the material used affects largely on the yield. Due also to inclusion of plating, curing and solder reflowing processes, the material needs to have sufficient solvent resistance, water resistance, heat resistance and high-temperature dimensional stability. Specific examples of such requirements include resistance to acids, alkalis and organic solvents; reduction of moisture absorption that affects electrical properties; high-temperature and post-heating dimensional stability that affects high-precision circuit connection between upper and lower layers; heat resistance up to 260° C. that is required for mounting by lead-free soldering; and reduced occurrence of copper migration that affects reliability of connections.

For example, buildup substrates for use in IC packages and multilayer printed substrates may be placed under high temperature conditions due to heat build-up, but they are still required to maintain high reliability under such conditions. However, a dimensional change of the resin when exposed to high temperatures, if large, causes separation thereof from a metal wiring such as circuit-forming copper to result in occurrence of short-circuiting or wire breaking, which has been a problem. The similar problem occurs even in the flexible multilayer substrate noticed recently as a thin sheet substrate, if an adhesive layer bonding flexible single-layer substrates to each other, a polyimide film constituting the flexible substrate and a metal wiring such as circuit-forming copper differ largely from each other by the degree of dimensional change that they undergo when exposed to heat.

Japanese Patent Laying-open No. 2000-183539 discloses a technique for improving high-temperature properties by using, in combination, an epoxy resin having superior heat resistance and an inorganic compound. Although the property improving effect is slightly observed at temperatures below a glass transition temperature, it is little observed at temperatures above the glass transition temperature. Neither of moisture absorbency and solvent resistance improving effects can be expected.

Loading of an inorganic filler has been conventionally known to reduce a linear expansion coefficient. This technique is however inapplicable to solder reflowing and other high-temperature treatments. Recent attention to environment has led to the use of a lead-free solder. Since the solder reflowing process temperature continues to increase, the mere use of a highly heat-resistance resin results in the occurrence of inconveniences during high-temperature treatments. That is, the increased linear expansion coefficient of the resin at temperatures above the glass transition temperature causes such inconveniences.

In recent years, the semiconductor mounting technology has showed marked progress. Particularly, the TAB (tape automated bonding) technology, because of its ability to form a conductor pattern with extremely high density, can readily respond to an increase in number of pins. Also, the high-density mounting technology has been actively developed which, during bonding, connects semiconductor elements to whole leads at one time without the use of wires.

There are two types of TAB tapes; two-layer structured and three-layer structured types. The three-layer structured type (hereinafter abbreviated as a three-layer TAB) generally comprises a conductor foil, such as a copper foil, combined with a heat-resistance resin film by an adhesive. This type of tape uses the resin film which has superior properties such as in heat resistance and chemical resistance. However, the tape is prevented from exhibiting such properties sufficiently by the incorporated adhesive layer which is inferior in heat resistance.

The two-layer structured TAB (hereinafter abbreviated as a three-layer TAB) shows improved heat resistance because its base film excludes an adhesive layer. However, it has been rarely put into practical use because of the difficulty to practice its manufacturing process.

The polyimide film, among organic polymers, has superior heat resistance, low-temperature properties, chemical resistance and electrical properties and can thus be used as a material for electrical and electronic devices. Further, it has been widely used in such fields that range from aerospace and aircraft fields to electronics and communication fields. However, polyimide does not sufficiently satisfy the required performances and must be tailored to exhibit the additional performances that vary depending upon the end use. A low water absorbency is desired for polyimide particularly when it is used as a material for high-performance and compact electronic devices. For example, the electric constant or other electrical property of polyimide drops as it absorbs more water. Also, the dimension of polyimide changes as it absorbs moisture and expands. The reduction in water absorbency is thus effective to reduce the occurrence of such unfavorable results. In the case of manufacture of a TAB tape that involves a number of processes accompanied with production of a stress or change in temperature, it is desired that an organic insulating film as a base undergoes little change in dimension when it is subjected to a stress or temperature change.

As such, for high performance, high function and small scale applications, TAB tapes, base films for flexible printed boards and laminate sheet resins are expected to undergo little change in dimension when exposed to water or heat and have high dielectric constants, as well as exhibiting resistance to heat. However, a polyimide film which fulfill these performances has not been obtained up to date.

Examples of useful polyimide films include "KAPTON" designated in trade and manufactured by Toray-Du Pont Co., Ltd., "UPILEX" designated in trade and manufactured by Ube Industries, Ltd. and "APICAL" designated in trade and manufactured by Kanegafuchi Chemical Industrial Co., Ltd. Although highly resistance to heat, these polyimide films decompose prior to being heated to softening temperatures. Accordingly, they are generally formed by a solvent casting process. This increases plant and manufacturing costs. Also, they are hard to be heat processed, which has been another problem.

The recent progress of optical communication technology demands an inexpensive way of connecting optical communication devices. Under such circumstances, polymeric optical communication materials have attracted attention. However, the use of conventional polymers as the optical communication materials creates various problems.

The polymeric optical communication material need to be low in loss, superior in heat resistance, low in linear expansion coefficient and low in moisture permeability. Also, they must be readily controllable in refractive index.

By "low in loss", it is meant that the polymeric material has substantially no absorption band in the wavelength range for use in the optical communication and is thus low in propagation loss.

Japanese Patent Laying-Open No. 2001-183539 describes that conventional polymeric materials exhibit approximately ten times the thermal expansion coefficient of semiconductor or metal material. It also describes that polymeric optical communication material, when formed on a silicon or other substrate having a low thermal expansion coefficient, produces a stress which causes unfavorable results, e.g., polarization dependence of the optical communication material, warpage of the optical communication material and substrate, or separation of the polymeric optical communication material from the substrate.

WO 98/45741 describes a problem of a difference in thermal expansion coefficient between an optical fiber (quartz glass) and a resin case that causes the optical fiber to project from a jacket or crack by stress concentration.

Japanese Patent Laying-Open No. Hei 9-152522 describes the case where an optical waveguide substrate is adhesively joined to an optical fiber. A difference in thermal expansion between the optical waveguide substrate and a connector part, if large, is described to cause positional shift during thermal expansion to result in the failure to achieve stable connection to an optical waveguide.

Concerning the moisture permeability, WO 98/45741 describes that a water vapor, if permitted to penetrate into an interior of a hollow case, condenses on a surface of an optical element or fiber to a liquid which problematically causes corrosion of the optical element or promotes growth of cracks leading to breaking of the optical fiber. It also describes that these factors and thermal expansion together lowers reliability of optical communication parts made of polymeric material. Also, the increased moisture absorbency increases the occurrence of light absorption based on an O—H bond of a moisture. This also addresses a need for a material which is low in moisture absorbency.

In order to introduce optical communication to terminal equipments, optical signals must be converted to or from electric signals. In such a case, polymeric optical communication material is used in a printed circuit board or in its vicinities. It is then required that the polymeric optical communication material should show resistance to process temperature during manufacture of a printed substrate as well as to heat radiated from an electric circuit while in use. Hitachi Technical Report No. 37 (July, 2001), at pages 7-16, describes solder heat resistance as a prescribed property.

As described above, the optical communication material is expected to have such properties as transparency, heat resistance, low linear expansion coefficient and low moisture absorbency.

Japanese Patent Registration No. 2843314 describes that fluorinated polyimide having a rigid and straight skeleton exhibits a low coefficient of linear thermal expansion.

Japanese Patent Laying-Open No. 2001-108854 discloses a polymeric optical waveguide comprised of a core layer, a clad layer surrounding the core layer and a second clad layer located outside the clad layer and having a lower thermal expansion coefficient than the clad layer. This reference describes that a difference in thermal expansion coefficient between the polymeric optical waveguide and an electric or optical element can be reduced by using different polymers for the clad lay and second clad layer so that the second clad layer has a relatively lower thermal expansion coefficient relative to the clad layer.

Japanese Patent Laying-Open No. 2001-4850 describes an optical communication medium comprised of an insulation film and a substrate and sealed at its ends with a resin which joins them together. This construction is described to prevent the insulating film and substrate from separating from each other at the ends of the medium where stress concentration is likely to occur.

Japanese Patent Laying-Open No. 2001-4850 describes that the use of a polyimide film having a specific structure for an optical wavelength resin effectively lowers a thermal expansion coefficient.

However, the fluorinated polyimide described in Japanese Patent Registration No. 2843314 is not suitable for use as a clad layer material of the optical communication device because it exhibits lower transparency compared to the other types of polyimides and has a high refractive index of 1.647.

It is suggested in Japanese Patent Laying-Open No. 2001-108854 that an optical wavelength resin containing the particles described therein may satisfy both the low linear expansion coefficient and required transparency. However, the particles must be added in a large amount to actually achieve reduction of linear expansion coefficient. Addition of such a large amount of the particles makes it difficult to achieve sufficient transparency, problematically provides a brittle and weak resin composition, and increases hydrophilicity and moisture absorbency.

The constitution described in Japanese Patent Laying-Open No. 2001-183539 adds to process steps. This inevitably pushes a cost up.

The specifically structured polyimide film described in Japanese Patent Laying-Open No. 2001-4850, when used as an optical wavelength resin, has been found to be difficult to achieve reduction in moisture absorbency, although possible to achieve reduction in thermal expansion coefficient. As a consequence, the cost associated with its use becomes high.

Therefore, it has been difficult to realize an optical circuit forming material which exhibits superior transparency, particularly high transparency, superior heat resistance, low coefficient of linear expansion and low moisture absorbency.

DISCLOSURE OF THE INVENTION

In view of the current state of the art, it is an object of the present invention to provide a resin composition, substrate material, sheet, laminated board, resin-bearing copper foil, copper-clad laminate, TAB tape, printed circuit board, prepreg, adhesive tape and optical circuit forming material, which are all excellent in mechanical properties, dimensional stability, heat resistance and flame retardancy, particularly in high-temperature physical properties.

The present invention is a resin composition which contains 100 parts by weight of a thermoplastic resin and 0.1-65 parts by weight of an inorganic compound and which has a mean linear expansion coefficient ($\alpha 2$) of $3.0\times 10^{-3}$ [$° C.^{-1}$] or below over a temperature range from a temperature 10° C. higher than a glass transition temperature of the resin composition to a temperature 50° C. higher than the glass transition temperature of the resin composition.

The present invention is below described in detail.

The resin composition of the present invention has a mean linear expansion coefficient (may also be hereinafter referred to as $\alpha 2$) of $3.0\times 10^{-3}$ [$° C.^{-1}$] or below over a temperature range from a temperature 10° C. higher than a glass transition temperature (may also be hereinafter referred to as Tg) of the resin composition to a temperature 50° C. higher than the glass transition temperature of the resin composition. Because of its mean linear expansion coefficient that does not exceed $3.0\times 10^{-3}$ [$° C.^{-1}$], a resin material comprised of the resin composition of the present invention shows a reduced dimensional change when heat treated at high temperatures and, when laminated with a copper foil or the like, can avoid the occurrence of warpage or separation that may result from the difference in shrinkage factor from the copper foil or the like.

The mean linear expansion coefficient of the resin composition is preferably $1.0\times 10^{-3}$ [$° C.^{-1}$] or below, more preferably $8.0\times 10^{-4}$ [$° C.^{-1}$] or below, further preferably $5.0\times 10^{-4}$ [$° C.^{-1}$] or below.

The mean linear expansion coefficient can be measured by a method according to JIS K 7197. For example, it can be determined by heating an about 3 mm×15 mm test piece at a rate of 5 C/min using a TMA (thermomechanical analysis) instrument (product of Seiko Instruments Inc., TMA/SS 120C).

Preferably, the resin composition of this invention exhibits a mean linear expansion coefficient ratio ($\alpha 2/\alpha 1$) of up to 70, where the mean linear expansion coefficient ratio is calculated by dividing the above-specified $\alpha 2$ by a mean linear expansion coefficient (may also be hereinafter referred to as a 1) over a temperature range from a temperature 50° C. lower than a Tg of the resin composition to a temperature 10° C. lower than the Tg of the resin composition. If this mean linear expansion coefficient ratio is up to 70, a resin material comprised of the resin composition of the present invention shows a reduced dimensional change at near Tg and, when laminated with the other material, can avoid the occurrence of warpage or wrinkle at near Tg. Preferably, the mean linear expansion coefficient ratio does not exceed 15, more preferably 10, most preferably 5.

Preferably, the resin composition of this invention has a mean linear expansion coefficient which does not exceed $4.5\times 10^{-5}$ [$° C.^{-1}$] over the 50-100° C. temperature range and does not exceed $7\times 10^{-5}$ [$° C.^{-1}$] over the 200-240° C. temperature range. If its mean linear expansion coefficient is within $4.5\times 10^{-5}$ [$° C.^{-1}$] over the 50-100° C. temperature range and within $7\times 10^{-5}$ [$° C.^{-1}$] over the 200-240° C. temperature range, a resin material comprised of the resin composition of this invention shows a reduced dimensional change under normal use conditions. Accordingly, it is suitable for use as an electronic material which must be precisely dimensioned. Also, the occurrence of warpage or separation can be avoided during fabrication and other processes which involve high-temperature treatment such as solder reflowing. The mean linear expansion coefficient of the resin composition over the 50-100° C. temperature range is more preferably within $4.0\times 10^{-5}$ [$° C.^{-1}$], further preferably within $3.5\times 10^{-5}$ [$° C.^{-1}$]. The mean linear expansion coefficient of the resin composition over the 200-240° C. temperature range is more preferably within $6.5\times 10^{-5}$ [$° C.^{-1}$], further preferably within $5.5\times 10^{-5}$ [$° C.^{-1}$].

Preferably, the resin composition of this invention exhibits a mean linear expansion coefficient ratio (1) of up to 2.0 and a mean linear expansion coefficient ratio (2) of up to 20, where the former ratio is calculated by dividing a mean linear expansion coefficient over the 150-200° C. temperature range by that over the 50-100° C. temperature range and the latter ratio is calculated by dividing a mean linear expansion coefficient over the 250-300° C. temperature range by that over the 50-100° C. temperature range. If the mean linear expansion coefficient ratio (1) is up to 2.0 and the mean linear expansion coefficient ratio (2) is up to 20, a resin material comprised of the resin composition of this invention exhibits good dimensional stability against heating. Also, the occurrence of warpage or separation thereof can be avoided during fabrication and other processes which involve high-temperature treatment such as reflowing of lead-free solder. Accordingly, such a resin material is suitable for high-temperature uses. The mean linear expansion coefficient ratio (1) is more preferably up to 1.5 and further preferably up to 1.2. The mean linear expansion coefficient ratio (2) is more preferably up to 15 and further preferably up to 10.

The resin composition of the present invention preferably exhibits a rate of change of up to 7%, where the rate of change is calculated by dividing a change in length of a resin piece comprised of the resin composition when heated from 25° C. to 300° C. by a length of the resin piece at 25° C. If the defined rate of change is within 7%, a resin material comprised of the resin composition of the present invention shows improved dimensional stability against temperature and, when laminated with the other material, can avoid occurrence of warpage or separation while in fabrication or in use. The above-defined rate of change is more preferably within 6%, further preferably within 5%.

Preferably, the resin composition of this invention exhibits a value of up to 1.5 for a mean linear expansion coefficient ratio (3) as determined by the following equation (1):

Mean linear expansion coefficient(3)=
mean linear expansion coefficient over
the $(\alpha+40)-(\alpha+60)°$ C. range/mean linear
expansion coefficient over the $\alpha-(\alpha+20)°$ C.
range        Equation (1).

In the equation, $\alpha(°\text{C.})$ is between 50° C. and 400° C. Also, those cases where the mean linear expansion coefficient ratio (3) is determined over a range across Tg are excluded.

If the mean linear expansion coefficient ratio (3) is within 1.5, a resin material comprised of the resin composition of this invention shows improved dimensional stability and, when laminated with the other material, can avoid occurrence of warpage or separation while in fabrication or in use. It is more preferably within 1.4, further preferably within 1.3.

Preferably, the resin composition of this invention exhibits an improvement factor of up to 0.50. The improvement factor is determined by dividing the mean linear expansion coefficient ($\alpha 2$) over the temperature range from a temperature 10° C. higher than the glass transition temperature of the resin composition to a temperature 50° C. higher than the glass transition temperature of the resin composition by the mean linear expansion coefficient over the temperature range from a temperature 10° C. higher than a glass transition temperature of the resin to a temperature 5° C. higher than the glass transition temperature of the resin. If the improvement factor is within 0.5, the inorganic compound provides sufficient improvements in high-temperature properties to a resin material comprised of the resin composition of this invention. Accordingly, such a resin material shows no trouble while in a fabrication process involving a high-temperature treatment or while in high-temperature use. The improvement factor is more preferably within 0.35, further preferably within 0.25.

Because of its low mean linear expansion coefficient over a high temperature range above the glass transition temperature, as described above, the resin composition of this invention exhibits improved high-temperature properties, such as in dimensional stability at high temperatures, and can be used as a resin material which avoids occurrence of warpage or separation in high-temperature treatment processes, such as a plating process, curing process and a reflowing process of a lead-free solder.

Preferably, the resin composition of this invention exhibits a tensile modulus of 6 GPa or above and a dielectric constant at 1 MHz of 3.3 or below. In the case where the resin composition of this invention is used for a TAB tape, if a tensile modulus of the resin composition is below 6 GPa, its thickness in some cases must be increased to insure required strength, possibly resulting in the failure to fabricate a small-sized TAB. If a dielectric constant of the resin composition at 1 MHz is higher than 3.3, its thickness in some cases must be increased to insure sufficient reliability, possibly resulting in the failure to fabricate a small-sized TAB.

Preferably, the resin composition of this invention exhibits a water absorbency of 1.0% or below and a linear humidity expansion coefficient of up to $1.5\times10^{-5}$ [% $RH^{-1}$]. If the water absorbency exceeds 1.0%, in the case where the resin composition of this invention is used to fabricate a board, there occurs a change in dimension of the board when oven-dried and when water-loaded. The water absorbency of the resin composition is more preferably within 0.7%, further preferably within 0.3%. If the linear humidity expansion coefficient of the resin composition exceeds $1.5\times10^{-5}$ [% $RH^{-1}$], warpage may occur in the resulting board. In some cases, the difference in rate of change between the resin composition and a copper foil may cause delamination of the copper foil. The linear humidity expansion coefficient of the resin composition is more preferably within $1.2\times10^{-5}$ [% $RH^{-1}$], further preferably $1.0\times10^{-5}$ [% $RH^{-1}$].

Preferably, the resin composition of this invention exhibits a water absorbency of 1.0% or below and a dielectric constant at 1 MHz of up to 3.3 and, after water absorption, exhibits a dielectric constant at 1 MHz of up to 3.4. Water absorption may cause a large change in electrical properties of the resin composition to result in the failure to keep reliability. Also, water absorption may cause bursting of materials during a fabrication process such as solder reflowing to result in the reduction of a yield.

The following procedure is utilized to determine the water absorbency. A 50-100 μm thick film is cut to a 3×5 cm strip to provide a test piece. The test piece is dried at 80° C. for hours and its weight W1 is measured. The dried test piece is then soaked with water, left to stand at 25° C. for 24 hours and well wiped at its surface. Thereafter, its weight W2 is measured. The water absorbency is calculated from the following equation:

Water absorbency(%)=$(W2-W1)/W1\times100$

The resin composition of the present invention preferably exhibits a glass transition temperature of not lower than 100° C. If a glass transition temperature of the resin composition of this invention is not lower than 100° C., its use for a substrate improves high-temperature physical properties of the substrate, particularly lead-free solder heat resistance and dimensional stability against heat. The glass transition temperature of the resin composition is more preferably 140° C. or above, further preferably 200° C. or above.

Preferably, the resin composition of this invention exhibits a glass transition temperature of 100° C. or above and a dielectric constant at 1 MHz of up to 3.3. If the resin composition of this invention exhibits a glass transition temperature of 100° C. or above and a dielectric constant at 1 MHz of not exceeding 3.3, a resin material comprised of the resin composition of this invention shows improved high-temperature physical properties, particularly in lead-free solder heat resistance and dimensional stability against heat, resulting in obtaining high reliability and a satisfactory signal transmission rate in a high-frequency range, both required for an electronic material. The glass transition temperature of the resin composition is more preferably 140° C. or above, further preferably 200° C. or above. The dielectric constant at 1 MHz of the resin composition is more preferably up to 3.2, further preferably 3.0.

The resin composition of this invention exhibits the above-stated excellent high-temperature physical properties and contains a thermoplastic resin and an inorganic compound.

Examples of thermoplastic resins include polyphenylene ether resins; functionally modified polyphenylene ether resins; mixtures of polyphenylene ether resins, such as styrene resins, or functionally modified polyphenylene ether resins and compatible thermoplastic resins; alicyclic hydrocarbon resins; thermoplastic polyimide resins; polyether ether ketone resins; polyether-sulfone resins; polyamide-imide resins; polyester imide resins; polyester resins; polyolefin resins; polystyrene resins; polyamide resins; polyvinyl acetal resins; polyvinyl alcohol resins; polyvinyl acetate resins; poly(meth) acrylate ester resins; polyoxymethylene resins; polyether imide resins and thermoplastic polybenzoimidazole resins. Suitably used among them are polyphenylene ether resins; functionally modified polyphenylene ether resins; mixtures of polyphenylene ether resins or functionally modified polyphenylene ether resins and polystyrene resins; alicyclic hydrocarbon resins; thermoplastic polyimide resins; polyether ether ketone resins; polyether imide resins and thermoplastic polybenzoimidazole resins. These thermoplastic resins may be used alone or in combination. In this specification, (meth)acryl refers to acryl or methacryl.

The polyphenylene ether resins refer to polyphenylene ether homopolymers or polyphenylene ether copolymers comprised of the repeating units represented by the following formula.

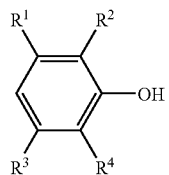

(2)

In the formula (2), R1, R2, R3 and R4 are independently a hydrogen atom, an alkyl group, an aralkyl group, an aryl group or an alkoxy group. These alkyl, aralkyl, aryl and alkoxy groups may be substituted by the other functional groups.

Examples of polyphenylene ether homopolymers include poly(2,6-dimethyl-1,4-phenylene) ether, poly(2-methyl-6-ethyl-1,4-phenylene) ether, poly(2,6-diethyl-1,4-phenylene) ether, poly(2-ethyl-6-n-propyl-1,4-phenylene) ether, poly(2,6-di-n-propyl-1,4-phenylene) ether, poly(2-ethyl-6-n-butyl-1,4-phenylene) ether, poly(2-ethyl-6-isopropyl-1,4-phenylene) ether and poly(2-metyl-6-hydroxyethyl-1,4-phenylene) ether.

Examples of polyphenylene ether copolymers include copolymers partially containing alkyl-trisubstituted phenol, such as 2,3,6-trimethylphenol, in the repeating units of the preceding polyphenylene ether homopolymers; copolymers made by further grafting one or more styrenic monomers, e.g., styrene, α-methylstyrene and vinyl toluene, to these polyphenylene ether copolymers; and the like. Such polyphenylene ether resins may be used alone. Alternatively, the polyphenylene ether resins having different compositions, components or molecular weights may be used in combination.

Examples of functionally modified polyphenylene ether resins include polyphenylene ether resins modified with one or more types of functional groups such as maleic anhydride, glycidyl, amino and allyl groups. These functionally modified polyphenylene ether resins may be used alone or in combination. The use of such functionally modified polyphenylene ether resins as the thermoplastic resin further improves, through a crosslinking reaction, mechanical properties, heat resistance, dimensional stability and the others of the resin composition of the present invention.

Examples of mixtures of polyphenylene ether resins or functionally modified polyphenylene ether resins and polystyrene resins include mixtures of polyphenylene ether resins or functionally modified polyphenylene ether resins with a styrene homopolymer; with copolymers of one or more of styrenic monomers such as styrene, α-methylstyrene, ethyl styrene, t-butyl styrene and vinyl toluene; and with polystyrene resins such as styrenic elastomers.

The above polystyrene resins may be used alone or in combination. Likewise, these mixtures of polyphenylene ether resins or functionally modified polyphenylene ether resins and polystyrene resins may be used alone or in combination.

The alicyclic hydrocarbon resin refers to a hydrocarbon resin containing a cyclic hydrocarbon group in its polymeric chain and can be illustrated by cyclic olefins such as homopolymers and copolymers of norbornene based monomers. These alicyclic hydrocarbon resins may be used alone or in combination.

Examples of cyclic olefins include norbornene, methanooctahydronaphthalene, dimethanooctahydronaphthalene, dimethanododecanehydroanthracene, dimethanodecahydroanthracene, trimethanododecahydroanthracene, dicyclo-pentadiene, 2,3-dihydrocyclopentadiene, methanooctahydrobenzindene, dimethanooctahydrobenzindene, methanodecahydro-benzindene, dimethanodecahydrobenzoindene, methanoocta-hydrofluorene, dimethanooctahydrofluorene and substituted derivatives thereof. These cyclic olefins may be used alone or in combination.

Examples of substituents incorporated in substituted derivatives of norbornene and others include generally-known hydrocarbon and polar groups such as alkyl, alkylidene, aryl, cyano, alkoxycarbonyl, pyridyl and halogen atoms. These substituents may be used alone or in combination.

Examples of substituted derivatives of norbornene include 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-phenyl-2-norbornene and 5-phenyl-5-methyl-2-norbornene. These substituted derivatives of norbornene may be used alone or in combination.

Commercially available alicyclic hydrocarbon resins include, for example, "ARTON" series from JSR (JSR) Corporation and "ZEONOA" series from Nippon Zeon Co., Ltd.

Examples of thermoplastic polyimide resins include polyetherimide resins having imide and ether bonds in the main molecular chain, polyamideimide resins having imide and amide bonds in the main molecular chain and polyesterimide resins having imide and ester bonds in the main molecular chain. The type of useful raw material is not particularly specified. Examples of materials include tetracarboxylic anhydrides such as pyromellitic anhydride, 3,3',4,4'-benzophenonetetra-carboxylic dianhydride, 3,3',4,4'-biphenyltetracarboxylic dianhydride, 3,31,4,4'-diphenylsulfone-tetracarboxylic dianhydride, 3,3', 4,4'-diphenylethertetracarboxylic dianhydride, ethylene glycol bis(anhydrotrimellitate), (5-dioxotetrahydro-3-furanyl)-3-methyl-3-cyclohexene-1,2-di caboxylic anhydride and 1,3,3a,4,5,9b-hexahydro-5-(tetrahydro-2,5-dioxo-3-furanyl)$_n$ aphtho[1,2-c]furane-1,3-dion; and diamines such as 4,4'-bis(3-aminophenoxy)biphenyl, bis[4-(3-aminophenoxy)phenyl]sulfone, 1,3-bis(4-aminophenoxy)benzene and 4,4'-diaminodiphenyl ether.

These thermoplastic polyimide resins may be used alone or in combination. Such thermoplastic polyimide resins are commercially available, for example, under the product name "AURUM" series from Mitsui Chemicals, Inc.

Examples of polyether ether ketone resins include resins obtained via polycondensation of dihalogenobenzophenone and hydroquinone. Such polyether ether ketone resins are commercially available, for example, under the product name "Victrex PEEK" series from ICI.

Examples of thermoplastic polybenzimidazole resins include resins obtained via polycondensation of dioctadecyl-terephthalaldoimine and 3,3'-diaminobenzidine. Such resins are commercially available, for example, under the product name "CERAZOL" series from Clariant Japan Co., Ltd.

Preferably, the thermoplastic resin has a solubility parameter (SP value) of 42 $[J/cm^3]^{1/2}$ or above, when calculated using a Fedors equation. The SP value, according to the Fedors equation, is given by a square root of a sum of molar cohesive energies of respective atomic groups and indicates a polarity per unit volume. The thermoplastic resin with a solubility parameter (SP value) of 42 $[J/cm^3]^{1/2}$ or above has a high polarity and thus shows good compatibility with an inorganic compound such as a chemically treated layer silicate. Accordingly, in the case where a layer silicate is used as the inorganic compound, such a thermoplastic resin is able to increase an interlayer spacing of the layer silicate and achieve layer by layer dispersion thereof. The SP value of the thermoplastic resin is more preferably 46.2 $[J/cm^3]^{1/2}$ or above, further preferably 52.5 $[J/cm^3]^{1/2}$ or above.

Examples of resins with SP values of 42 $[J/cm^3]^{1/2}$ and above include polyester resins such as polybutylene terephthalate, polybutylene naphthalate, polyethylene terephthalate and polyethylene naphthalate; polyamide resins such as polyamide 6, polyamide 66 and polyamide 12; polyamide-imide resins; polyimide resins; polyesterimide resins; polyetherimide resins; polyether ether ketone resins; polyphenylene ether resins; modified polyphenylene ether resins and polybenz-imidazole resins.

The thermoplastic resin preferably exhibits a 10% weight loss temperature of at least 400° C. in the thermogravimetric measurement under nitrogen atmosphere. If at least 400° C., the resin composition of this invention provide a resin material which avoids outgassing in high-temperature treating processes such as lead-free solder reflowing, making it suitable for use as an electronic material. The 10% weight loss temperature of the thermoplastic resin is more preferably at least 450° C., further preferably at least 500° C. Examples of resins which exhibit a 10% weight loss temperature of at least 400° C. in the thermogravimetric measurement under nitrogen atmosphere include polyetheretherketone resins, polyetherimide resins, polyamideimide resins and thermoplastic polyimide resins.

The resin composition of this invention contains an inorganic compound.

Examples of inorganic compounds include layer silicate, talc, silica, alumina and glass beads. For the purpose of improving high-temperature physical properties, the use of a layer silicate, among them, is preferred. In the specification of this application, the layer silicate refers to a layered silicate mineral, either synthetic or natural, which has exchangeable metal cations between layers.

Particularly when high tensile modulus is sought, a combination of layer silicate and whisker, as the inorganic compound, is preferably incorporated in the resin composition. Although incorporation of whisker into resins is known to improve modulus, resin compositions incorporating whisker in the amount sufficient to attain high tensile strength suffer from a problem of poor moldability or extrudability. In the present invention, a combination of whisker and layer silicate is used as the organic compound. Accordingly, sufficient modulus improvement can be achieved by incorporation of a smaller amount of whisker.

In the case where whisker and layer silicate are used in combination as the inorganic compound, whisker is preferably incorporated to the extent of 25-95% by weight, based on 100% by weight of the inorganic compound. If the incorporation of whisker is below 25% by weight, the effect of incorporating whisker may become insufficient. If it exceeds 95% by weight, the effect of adding layer silicate may become insufficient.

Particularly when low water absorbency is needed, it is preferred that the resin composition contains layer silicate and silica as the inorganic compound. The type of silica is not particularly specified. One example is AEROSIL from Japan Aerosil Co., Ltd. The use of silica and layer silicate as the inorganic compound effectively reduces moisture absorbency of a polymeric material obtained from the resin composition of this invention. Incorporation of silica into resins is known to improve water absorbency. However, such resin compositions that incorporate silica in the amount sufficient to attain low water absorbency suffer from a problem of low tensile strength or other physical properties. In this invention, the resin composition uses a combination of silica and layer silicate as the organic compound. A sufficient, water absorbency reducing effect can thus be obtained by incorporation of a smaller amount of silica. Preferably, silica accounts for 25-95% by weight of the inorganic compound. If the silica content is below 25% by weight of the inorganic compound, the sufficient effect of blending layer silicate and silica may not be obtained. On the other hand, if it exceeds 95% by weight of the inorganic compound, the effect of adding layer silicate may not be obtained.

Examples of layer silicates include smectite clay minerals such as montmorillonite, hectorite, saponite, beidellite, stevensite and nontronite; swelling mica; vermiculite; and halloysite. Among them, at least one selected from the group consisting of montmorillonite, hectorite, swelling mica and vermiculite is preferably used. These layer silicates may be used alone or in combination.

The crystal shape of the layer silicate used is not particularly specified. Preferably, the layer silicate has a mean length from 0.01 μm to 3 μm, a thickness from 0.001 μm to 1 μm and an aspect ratio from 20 to 500. More preferably, the layer silicate has a mean length from 0.05 μm to 2 μm, a thickness from 0.01 μm to 0.5 μm and an aspect ratio from 50 to 200.

The layer silicate preferably shows a large value for the shape anisotropy effect defined by the following equation (3A). With the use of layer silicate having a large shape anisotropy effect, the resin composition of this invention can provide resins which exhibit excellent mechanical properties.

Shape anisotropy effect=area of a surface of a flaky crystal that extends along a plane of lamination/area of a surface of the flaky crystal that extends across the plane of lamination     Equation (3A)

The exchangeable metal cations present between layers of the layer silicate refers to metal ions, such as sodium and calcium ions, which exist on surfaces of flaky crystals of the layer silicate. These metal ions are cation exchangeable with cationic materials so that they can insert (intercalate) various cationic materials between crystal layers of the layer silicate.

The cation exchange capacity of the layer silicate is not particularly specified. However, it may preferably be from 50 milliequivalents/100 g to 200 milliequivalents/100 g. If the cation exchange capacity is below 50 milliequivalents/100 g, the amount of cationic materials intercalated, through cation exchange, between crystal layers of the layer silicate may be reduced to result in the occasional failure to fully nonpolarize (hydrophobicize) the space between crystal layers. If the cation exchange capacity exceeds 200 milliequivalents/100 g, a bonding force of adjacent crystal layers of the layer silicate may become excessively strong to result in the difficulty for crystal layers to separate from each other.

In the preparation of the resin composition of this invention, the layer silicate for use as the inorganic compound is preferably chemically modified to increase its affinity for the resin so that its dispersion in the resin is improved. Such chemical modification allows the layer silicate to disperse in a large quantity in the resin. Without chemical modification as appropriate to the resin for use in this invention or to a solvent for use in the preparation of the resin composition of this invention, the layer silicate has a tendency to agglomerate to result in the failure to disperse in a large quantity in the resin. However, chemical modification as appropriate to the resin or to the solvent allows the layer silicate, even when incorporated in the amount of 10 parts by weight or more, to readily disperse in the resin without agglomeration. Chemical modification can be achieved, for example, by the following methods (1)-(6). These chemical modification methods may be employed alone or in combination.

The chemical modification method (1) is also referred to as a cation exchange method using a cationic surfactant. Specifically, the layer silicate is cation exchanged at its interlayer spaces with a cationic surfactant so that they are hydrophobicized, before the resin composition of this invention is obtained using a low-polarity resin such as a polyphenylene ether resin. The previous hydrophobicization of interlayer spaces of the layer silicate increases an affinity between the layer silicate and the low-polarity resin, so that the layer silicate can be more uniformly and finely dispersed in the low-polarity resin.

The cationic surfactant is not particularly specified. Examples of cationic surfactants include quaternary ammonium salts and quaternary phosphonium salts. The use of alkyl ammonium ions containing 6 or more carbon atoms, aromatic quaternary ammonium ions and heterocyclic quaternary ammonium ions is preferred for their ability to fully hydrophobicize spaces between crystal layers of the layer silicate. Particularly when a thermoplastic polyimide resin, polyesterimide resin or polyetherimide resin is used as the thermoplastic resin, the use of aromatic quaternary ammonium ions and heterocyclic quaternary ammonium ions is preferred.

The quaternary ammonium salt is not particularly specified in type. Examples of quaternary ammonium salts include trimethylalkyl ammonium salts, triethylalkyl ammonium salts, tributylalkyl ammonium salts, dimethyldialkyl ammonium salts, dibutyldialkyl ammonium salts, methylbenzyl-dialkyl ammonium salts, dibenzyldialkyl ammonium salts, trialkyl-methyl ammonium salts, trialkylethyl ammonium salts and trialkylbutylbutyl ammonium salts; aromatic quaternary ammonium salts such as benzylmethyl{2-[2-(p-1,1,3,3-tetramethylbutylphenooxy)ethox y]ethyl}ammonium chloride; aromatic amine-derived quaternary ammonium salts such as a trimethylphenyl ammonium salt; heterocyclic quaternary ammonium salts such as alkyl pyridinium salts and imidazolium salts; dialkyl quaternary ammonium salts having two polyethylene glycol chains, dialkyl quaternary ammonium salts having two polypropylene glycol chains, trialkyl quaternary ammonium salts having a polyethylene glycol chain and trialkyl quaternary ammonium salts having a polypropylene glycol chain. Preferred among them are a lauryltrimethyl ammonium salt, stearyltrimethyl ammonium salt, trioctylmethyl ammonium salt, distearyldimethyl ammonium salt, di-hardened tallow-dimethyl ammonium salt, distearyl-dibenzyl ammonium salt and N-polyoxyethylene-N-lauryl-N,N'-dimethyl ammonium salt. These quaternary ammonium salts may be used alone or in combination.

The quaternary phosphonium salt is not particularly specified in type. Examples of quaternary phosphonium salts include a dodecyltriphenyl phosphonium salt, methyltriphenyl phosphonium salt, lauryltrimethyl phosphonium salt, stearyl trimethyl phosphonium salt, trioctylmethyl phosphonium salt, distearyldimethyl phosphonium salt and distearyldibenzyl phosphonium salt. These quaternary phosphonium salts may be used alone or in combination.

The chemical modification method (2) utilizes a compound having, at its molecular terminal, at least one functional group either chemically linkable to a hydroxyl group or having a high chemical affinity for a hydroxyl group to chemically treat hydroxyl groups present on crystal surfaces of the organically modified layer silicate which has been chemically treated by the chemical modification method (1).

The functional group either chemically linkable to a hydroxyl group or having a high chemical affinity for a hydroxyl group is not particularly specified and can be illustrated by alkoxy, glycidyl, carboxyl (including dibasic anhydride), hydroxyl, isocyanate and aldehyde.

The compound having a functional group chemically linkable to a hydroxyl group or the compound having a functional group having a high chemical affinity for a hydroxyl group is not particularly specified and can be illustrated by a silane compound, a titanate compounds, a glycidyl compound, various carboxylic acids and alcohols, which respectively have any of the preceding functional groups. These compounds may be used alone or in combination.

The silane compound is not particularly specified. Examples of silane compounds include vinyltrimethoxysilane, vinyltriethoxysilane, vinyltris(β-methoxyethoxy)silane, γ-aminopropyltrimethoxysilane, γ-aminopropylmethyldimethoxy-silane, γ-aminopropyldimethylmethoxysilane, γ-aminopropyl-triethoxysilane, γ-aminopropyldiethoxysilane, γ-amino-propyldimethylethoxysilane, methyltriethoxysilane, dimethyl-dimethoxysilane, trimethylmethoxysilane, hexyltrimethoxy-silane, hexyltriethoxysilane, N-β-(aminoethyl)γ-amino-propyltrimethoxysilane, N-β-(aminoethyl)γ-aminopropyl-triethoxysilane, N-β-(aminoethyl)γ-aminopropylmethyl-dimethoxysilane, octadecyltrimethoxysilane, octadecyl-triethoxysilane, γ-methacryloxypropylmethyldimethoxysilane, γ-methacryloxypropylmethyldiethoxysilane, γ-methacryloxy-propyltrimethoxysilane and γ-methacryloxypropyltriethoxy-sialne. These silane compounds may be used alone or in combination.

The chemical modification method (3) utilizes a compound having, at its molecular terminal, a functional group either chemically linkable to a hydroxyl group or having a high chemical affinity for a hydroxyl group and at least one reactive functional group to chemically treat hydroxyl groups present on crystal surfaces of the layer silicate which has been organically modified by the chemical modification method (1).

The chemical modification method (4) utilizes a compound having an anionic surface activity to chemically treat hydroxyl groups present on crystal surfaces of the layer silicate which has been organically modified by the chemical modification method (1).

The compound having an anionic surface activity is not particularly specified in type, so long as it can chemically treat the layer silicate by ionic interaction. Examples of such compounds include sodium laurate, sodium stearate, sodium oleate, sulfate ester salts of higher alcohols, sulfate ester salts of secondary higher alcohols and sulfate ester salts of unsaturated alcohols. These compounds maybe used alone or in combination.

The chemical modification method (5) utilizes any of the aforementioned compounds having an anionic surface activity that contains at least one reactive functional group at a site other than the anionic site in the molecular chain to achieve the chemical treatment.

The chemical modification method (6) further utilizes a resin having a functional group reactive with a layer silicate, e.g., a maleic anhydride modified polyphenylene ether resin, besides any of the organically modified layer silicates which have been chemically treated by the chemical modification methods (1)-(5), respectively.

Preferably, the layer silicate is dispersed in the resin composition of this invention such that it has a mean interlayer spacing of at least 3 nm along the (001) plane, when measured by an X-ray diffraction method, and a part or all of stacks consists of 5 or less layers. If the layer silicate is dispersed such that it has a mean interlayer spacing of at least 3 nm and a part or all of stacks consists of 5 or less layers, an interfacial area between the resin and the layer silicate is rendered sufficiently large. Also, a distance between flaky crystals of the layer silicate is rendered to fall within a proper range. As a result, the improving effects by dispersion can be fully obtained such as in high-temperature physical properties, mechanical properties, heat resistance and dimensional stability.

Preferably, the mean interlayer spacing does not exceed 5 nm. If it exceeds 5 nm, the layer-by-layer separation of crystalline flakes of the layer silicate may occur to weaken their interaction to the negligible extent. Then, the binding strength is weakened to occasionally result in the failure to obtain sufficient dimensional stability.

In this specification, the mean interlayer spacing of the layer silicate refers to a mean value of distances between adjacent layers when flaky crystals of the layer silicate are regarded as individual layers, and can be calculated from X-ray diffraction peaks and photographs taken using a transmission electron microscope, i.e., by a wide-angle X-ray diffraction measurement method.

By "the layer silicate is dispersed such that a part or all of stacks consists of 5 or less layers", it is specifically meant that a part or all of stacks of flaky crystals is dispersed due to the weakened interaction between adjacent flaky crystals of the layer silicate. Preferably, at least 10% of stacks of layer silicate is dispersed in the form a stack consisting of 5 or less layers. More preferably, at least 20% of stacks of layer silicate is dispersed in the form of a stack consisting of 5 or less layers.

A proportion of layer silicate that is dispersed in the form of a stack consisting of 5 or less layers can be determined by observing the resin composition by a transmission electron microscope at a magnification of 50,000-100,000, measuring a total number X of layers of layer silicate observable in a particular area and a number Y of layers of layer silicate dispersed in the form of a stack consisting of 5 or less layers, and calculating from the following equation (4):

Proportion (%) of layer silicate that is dispersed in the form of a stack consisting of 5 or less layers=
$(Y/X) \times 100$      Equation (4)

In order to obtain the effect of dispersion, the layer silicate preferably exists in the form of a stack consisting of 5 or less layers, more preferably 3 or less layers, further preferably in the form of a single layer.

The resin composition of this invention uses a layer silicate as the inorganic compound. The layer silicate is dispersed such that it has a mean interlayer spacing of at least 3 nm along the (001) plane, when measured by an X-ray diffraction method, and a part or all of stacks consists of 5 or less layers. By satisfying these conditions, an interfacial area between the resin and the layer silicate is rendered sufficiently large to increase interactions between the resin and surfaces of the layer silicate. The resulting increase in melt viscosity improves moldability or extrudability. Also, mechanical properties, e.g., elastic modulus over a wide temperature range from ordinary temperature to high temperature, are improved and can thus be retained even at high temperatures above Tg or a melting point of the resin. As a result, the linear expansion coefficient of the resin composition at high temperatures can be maintained at lower values. Although what brings these results is not clear, it is believed that finely dispersed layer silicate serves in its way as pseudocrosslink points to achieve improvements of such physical properties.

Also, the distance between adjacent flaky crystals of layer silicate is rendered to fall within a proper range, so that those flaky crystals of layer silicate, when combusted, become more likely to move and form a sintered body which constitutes a flame-retardant coating. This sintered body is formed at an early stage of combustion and can thus block oxygen supply from outside and any combustible gas generated by combustion. Therefore, the resin composition of this invention exhibits excellent flame-retardant properties.

Furthermore, in the resin composition of this invention, the layer silicate is finely dispersed on a nanometer scale. Accordingly, in the case where a substrate or the like comprised of the resin composition of this invention is laser drilled such as by a carbon dioxide gas laser, resin components and layer silicate components are decomposed or vaporized simultaneously. Even partially-left drillings of the layer silicate only have sizes of up to several um and can be readily removed by desmear processing. This reduces the tendency of drillings to cause occurrence of defective plating or the like.

The method used to disperse the layer silicate in the resin composition is not particularly specified. Examples of dispersing methods include a method utilizing an organically modified layer silicate; a method which comprises, in sequence, mixing the resin and layer silicate by a conventional technique and expanding the resin using a blowing agent; and a method using a dispersant. By using these dispersing methods, the layer silicate can be dispersed more uniformly and finely in the resin composition.

The preceding method comprising, in sequence, mixing the resin and layer silicate by a conventional technique and expanding the resin using a blowing agent is a method which utilizes an energy evolved during expansion to disperse the layer silicate.

The type of the blowing agent is not particularly specified. Examples of blowing agents include gaseous blowing agents, volatile liquid blowing agents, heat-decomposable solid blowing agents and the like. These blowing agents may be used alone or in combination.

The method comprising, in sequence, mixing the resin and layer silicate by a conventional technique and expanding the resin using a blowing agent is not particularly specified. Examples of such methods include a method in which a gaseous blowing agent is impregnated under higher pressure into a resin composition comprising the resin and layer silicate and then vaporized therein to form a resin foam; a method in which a heat decomposable blowing agent is loaded in spaces between adjacent layers of the layer silicate and then decomposed by application of heat to form a resin foam; and the like.

The inorganic compound is incorporated in the amount from 0.1 parts by weight to 65 parts by weight, based on 100 parts by weight of the thermoplastic resin. If its loading is below 0.1 parts by weight, the high-temperature properties or moisture absorbency improving effect is lowered. If its loading exceeds 65 parts by weight, the resin composition of this invention becomes high in density (specific gravity) and low in mechanical strength, making it unsuitable for practical use. Preferably, the inorganic compound is loaded in the amount from 1 part by weight to 60 parts by weight. If the loading is below 1 part by weight, the sufficient improving effect on high-temperature properties may not be obtained when the resin composition of this invention is thin processed. If the loading exceeds 60 parts by weight, the moldability or extrudability may be lowered. More preferably, the inorganic compound is loaded in the amount from 1.5 parts by weight to 50 parts by weight. Within the range of 1.5-50 parts by weight, no regions exist which provide problems regarding mechanical properties and process suitability, resulting in obtaining sufficient flame retardance.

In the case where a layer silicate is used as the inorganic compound among the resin composition of this invention, the layer silicate is preferably incorporated therein in the amount from 0.5 parts by weight to 50 parts by weight. If its loading is below 0.5 parts by weight, the high-temperature properties or moisture absorbency improving effect may be lowered. If its loading exceeds 50 parts by weight, the resin composition of this invention becomes higher in density (specific gravity) and lower in mechanical strength, possibly making it unsuitable for practical use. Preferably, the layer silicate is incorporated in the amount from 1 part by weight to 45 parts by weight. If its loading is below 1 part by weight, the sufficient high-temperature properties improving effect may not be obtained when the resin composition of this invention is thin processed. If its loading exceeds 45 parts by weight, the dispersibility of the layer silicate may be lowered. More preferably, the layer silicate is incorporated in the amount from 1.5 parts by weight to 40 parts by weight. Within the range of 1.5-40 parts by weight, no regions exist which provide problems regarding process suitability, resulting in obtaining sufficiently low water absorbency. Also, the effect of reducing the mean linear expansion coefficient is obtained sufficiently in both regions $\alpha 1$ and $\alpha 2$.

Preferably, the resin composition of this invention further contains a halogen-free flame retardant. It is however understood that this is not intended to exclude the case where a slight amount of halogen is mixed in the flame retardant for certain reasons during its manufacturing process.

The flame retardant is not particularly specified in type. Examples of flame retardants include metallic hydroxides such as aluminum hydroxide, magnesium hydroxide, dorsonite, calcium aluminate, dihydrate gypsum and calcium hydroxide; metallic oxides; phosphorus compounds such as red phosphorus and ammonium polyphosphate; nitrogen compounds such as melamine, melamine cyanurate, melamine isocyanurate, melamine phosphate and melamine derivatives prepared by subjecting them to a surface treatment; fluoro resins; silicone oil; layered polyhydrates such as hydrotalsite; silicone-acryl composite rubber; and the like. Among them, metallic hydroxides and melamine derivatives are preferred. Particularly preferred among metallic hydroxides are magnesium hydroxide and aluminum hydroxide which may be treated at their surfaces by various surface treatment agents. Examples of surface treatment agents include, but not limited to, silane coupling agents, titanate coupling agents and PVA surface treatment agents. These flame retardants may be used alone or in combination.

The metallic hydroxide, if used as the flame retardant, is preferably incorporated in the amount from 0.1 parts by weight to 100 parts by weight, based on 100 parts by weight of the thermoplastic resin. If its loading is below 0.1 parts by weight, a sufficient flame retarding effect may not be obtained. If its loading exceeds 100 parts by weight, the resin composition of this invention becomes excessively high in density (specific gravity), possibly making it unsuitable for practical use. In some cases, a marked reduction in flexibility or extensibility thereof may result. More preferably, the metallic hydroxide is incorporated in the amount from 5 parts by weight to 80 parts by weight. If its loading is below 5 parts by weight, a sufficient flame retarding effect may not be obtained when the resin composition of this invention is thin processed. On the other hand, if its loading exceeds 80 parts by weight, blistering or the like may occur in high-temperature treatment processes to increase a percent defective. Further preferably, the metallic hydroxide is incorporated in the amount from 10 parts by weight to 70 parts by weight. If its loading is within the range of 10-70 parts by weight, no regions exist where problems arise regarding mechanical properties, electrical properties, process suitability or the like, and the resin composition exhibits sufficient flame retardance.

The melamine derivative, if used as the flame retardant, is preferably incorporated in the amount from 0.1 parts by weight to 100 parts by weight, based on 100 parts by weight of the thermoplastic resin. If its loading is below 0.1 parts by weight, a sufficient flame retarding effect may not be obtained. If its loading exceeds 100 parts by weight, a marked reduction in flexibility, extensibility or other mechanical properties of the resin composition may result. More preferably, the melamine derivative is incorporated in the amount from 5 parts by weight to 70 parts by weight. If its loading is below 5 parts by weight, a sufficient flame retarding effect may not be obtained when an insulating substrate is rendered thin. On the other hand, if its loading exceeds 70 parts by weight, a marked reduction in flexibility, extensibility or other mechanical properties of the resin composition may result. Further preferably, the melamine derivative is incorporated in the amount from 10 parts by weight to 50 parts by weight. If its loading is within the range of 10-50 parts by weight, no regions exist where problems arise regarding mechanical properties, electrical properties, process suitability or the like, and the resin composition exhibits sufficient flame retardance.

When needed to modify its properties, various additives may be incorporated in the resin composition of this invention within the range that does not impede achievement of objects of this invention. Examples of such additives include thermoplastic elastomers, crosslinked rubbers, oligomers, nucleating agents, antioxidants (age resisters), thermal stabilizers, light stabilizers, ultraviolet absorbers, lubricants, auxiliary flame retardants, antistatic agents, antifogging agents, fillers, softeners, plasticizers, coloring agents and the like. These additives may be used alone or in combination.

The types of useful thermoplastic elastomers are not particularly limited. Examples of thermoplastic elastomers include styrenic elastomers, olefinic elastomers, urethane elastomers and polyester elastomers. These elastomers may be functionally modified to increase their compatibility with the resin used. These elastomers may be used alone or in combination.

Useful crosslinked rubbers are not particularly limited in type. Examples of crosslinked rubbers include isoprene rubber, butadiene rubber, 1,2-polybutadiene, styrene-butadiene rubber, nitrile rubber, butyl rubber, ethylene-propylene rubber, silicone rubber and urethane rubber. These crosslinked rubbers may preferably be functionally modified to increase their compatibility with the resin used. Such functionally-modified, crosslinked rubbers are not limited in type and can be illustrated by epoxy modified butadiene rubbers and epoxy modified nitrile rubbers. These crosslinked rubbers may be used alone or in combination.

Useful oligomers are not particularly limited in type and can be illustrated by maleic anhydride modified polyethylene oligomers. These oligomers may be used alone or in combination.

Various methods can be utilized to manufacture the resin composition of this invention. Examples of useful methods include a direct kneading method wherein a formulation of the resin, inorganic compound and one or more optional additives is directly blended and kneaded under normal temperature or under heat conditions, and a method which involves mixing those ingredients in a solvent and subsequently removing the solvent; a masterbatch method wherein a masterbatch is first prepared by incorporating a prescribed or greater amount of the inorganic compound in the resin or other resin and kneading them, and this masterbatch in a prescribed amount, the resin in the amount that makes up the deficiency and one or more optional additives in their prescribed amounts are kneaded or mixed in a solvent under normal temperature or under heat conditions.

In the masterbatch method, the masterbatch prepared by incorporating the inorganic compound in the resin or other resin may have the same or different composition as a masterbatch diluting resin composition which contains the resin and is used to dilute the masterbatch and bring the inorganic compound to a desired concentration.

The masterbatch is not particularly specified, but may preferably contain at least one resin selected from the group consisting of a polyamide resin, a polyphenylene ether resin, a polyether sulfone resin and a polyester resin, which resin readily disperses the inorganic compound. The masterbatch diluting resin composition is not particularly specified, but may preferably contain at least one resin selected from the group consisting of a thermoplastic polyimide resin, polyether ether ketone resin and thermoplastic polybenzimidazole resin, which all exhibit good high-temperature physical properties.

The loading of the inorganic compound in the masterbatch is not particularly specified, but may preferably be in the range from 1 part by weight to 500 parts by weight, based on 100 parts by weight of the resin. If the loading is below 1 part by weight, the advantage of the masterbatch which can be diluted to a desired concentration may diminish. If the loading exceeds 500 parts by weight, dispersibility of the masterbatch itself, particularly of the inorganic compound when diluted by the masterbatch diluting resin composition to a predetermined loading, may be lowered. Preferably, the inorganic compound is loaded in the masterbatch in the amount from 5 parts by weight to 300 parts by weight.

Also, a method can be utilized which employs an inorganic compound containing a polymerization catalyst (polymerization initiator) such as transition metal complexes. By kneading a thermoplastic resin monomer and the inorganic compound and then polymerizing the monomer, the resin composition is manufactured simultaneously with polymerization of the thermoplastic resin.

In the preceding methods for manufacture of the resin composition of this invention, the mixture can be kneaded by such techniques as using various kneaders, including an extruder, a two-roll mill and a Banbury mixer.

In the resin composition of this invention, the resin is combined with the inorganic compound so that a Tg and a heat distortion resistance temperature of the resin composition are increased due to the restraint of molecular chains. As a result, the resin composition of this invention has a low coefficient of linear expansion and exhibits improved heat resistance, transparency and physical properties.

Because gaseous molecules have a much higher likelihood of diffusing in the resin, relative to the inorganic compound, and they diffuse therein while moving around the inorganic compound, the resin composition also exhibits improved gas barrier properties. Likewise, the resin composition shows improved gas barrier properties against substances other than such gaseous molecules and exhibits improved solvent resistance, moisture absorbency and water absorbency. This prevents migration of copper from a copper circuit in a multilayer printed wiring board, for example. Also, the occurrence of bleedout of a small amount of additives and following defective plating can be prevented.

The use of the layer silicate as the inorganic compound, even if not incorporated in a large amount, results in obtaining improved physical properties. The resin composition can thus be used to form a thin insulating substrate. This enables manufacture of high-density and thin multilayer printed wiring boards. Also, the nucleating effect of the layer silicate during crystal formation, as well as the swell-restraining effect attributed to the improved moisture resistance, provide an improvement in dimensional stability of the resin composition. Also, because the layer silicate when combusted forms a sintered body, the shape of combusted residues is retained and remains unchanged even after combustion, thereby preventing flame spread. Therefore, the resin composition exhibits improved flame retardance.

Also, the use of a non-halogen flame retardant increases physical properties as well as flame retardance of the resin composition of this invention, while giving consideration to the environment.

The resin composition of this invention has various uses. For example, it may be processed, e.g., dissolved into a solvent or formed into a film, into various forms suitable for use as a substrate material which forms a core or buildup layer of a multilayer substrate, sheet, laminate board, resin-bearing copper foil, copper-clad laminate, TAB tape, printed wiring board, prepreg, varnish and the like. These substrate material, sheet, laminate board, resin-bearing copper foil, copper-clad laminate, TAB tape, printed wiring board, prepreg and adhesive tape also fall within the range of this invention.

The processing method is not particularly specified. Examples of processing methods include an extrusion method wherein the resin composition is melt kneaded by an extruder and then formed into a film as by a T-die or a circular die; a casting method wherein the resin composition is dissolved or dispersed in an organic or other solvent and then cast into a film; a dipping method wherein the resin composition is dissolved or dispersed in an organic or other solvent to provide a varnish into which a cloth-like or nonwoven-like base of an inorganic material, such as glass, or an organic polymer is subsequently dipped to form a film; and the like. Among them, the extrusion method is more suitable for provision of a thin multilayer board. The base used in the dipping method is not particularly specified and may comprise a glass cloth, aramid fibers, polyparaphenylene benzoxazole fibers or the like, for example.

Since the substrate material, sheet, laminate board, resin-bearing copper foil, copper-clad laminate, TAB tape, printed wiring board, prepreg, adhesive tape and optical circuit forming material of this invention comprise the resin composition of this invention, they all exhibit improved high-temperature properties, dimensional stability, solvent resistance, moisture resistance and barrier properties, and can be obtained at high yields even when they are manufactured via multiple processes. In this specification, the sheet is referred to as encompassing non-self supporting films. The sheet may be embossed at its surface to better its slip characteristics.

The use of thermoplastic resins reduces facility and manufacturing costs. Such thermoplastic resins and can be readily processed into desired shapes. For example, embossing and sheeting can be performed at the same time. The sheet can be later processed in a simple manner. Also, those resins are reusable by melt processing. A low load on the environment is another advantage.

The resin composition of this invention includes a layer silicate finely dispersed therein on a nanometer scale and thus has a low coefficient of linear expansion, high heat-resisting properties and low water absorbency, as well as having high transparency. Hence, the resin composition of this invention can be suitably used as optical circuit forming material such as optical package forming material, optical waveguide material, connector material or sealing material.

BEST MODE FOR CARRYING OUT THE INVENTION

The present invention is below described in detail by way of non-limiting examples.

EXAMPLE 1

100 parts by weight of a modified polyphenylene ether resin (product of Asahi Kasei Corp., ZYLON (PKL) X9102) as thermoplastic resin and 30 parts by weight of swelling fluorine mica (product of CO-OP Chemical Co., Ltd., SOMASIF MAE-100) organically modified with a distearyldimethyl quaternary ammonium salt, as a layer silicate, were fed into a compact-size extruder (product of Japan Steel Works, Ltd., TEX-30), melt kneaded at 290° C. and extruded into strands which were then pelletized by a pelletizer to provide a masterbatch. Next, 100 parts by weight of a polyimide resin (product of Mitsui Chemicals, Inc., AURUM PD-450) as a thermoplastic resin and 9.5 parts by weight of the above-obtained masterbatch were fed into a compact-size extruder (product of Japan Steel Works, Ltd., TEX-30), melt kneaded at 420° C. under a stream of nitrogen and extruded into strands which were subsequently pelletized by a pelletizer to provide pellets of the resin composition. The thus-obtained pellets of the resin composition were placed under a stream of nitrogen and then heat pressed between upper and lower rolls both controlled at 420° C. to prepare 2 mm and 100 μm thick plates of the resin composition.

EXAMPLE 2

100 parts by weight of a modified polyphenylene ether resin (product of Asahi Kasei Corp., ZYLON (PKL) X9102) as a thermoplastic resin and 30 parts by weight of swelling fluorine mica (product of CO-OP Chemical Co., Ltd., SOMASIF MAE-100) organically modified with a distearyldimethyl quaternary ammonium salt, as a layer silicate, were fed into a compact-size extruder (product of Japan Steel Works, Ltd., TEX-30), melt kneaded at 280° C. and extruded into strands which were then pelletized by a pelletizer to provide a masterbatch. Next, 100 parts by weight of polyether ether ketone as a thermoplastic resin and 9.5 parts by weight of the above-obtained masterbatch were fed into a compact-size extruder (product of Japan Steel Works, Ltd., TEX-30), melt kneaded at 400° C. under a stream of nitrogen and extruded into strands which were subsequently pelletized by a pelletizer to provide pellets of the resin composition. Thus-obtained pellets of the resin composition were placed under a stream of nitrogen and then heat pressed between upper and lower rolls both controlled at 400° C. to prepare 2 mm and 100 μm thick plates of the resin composition.

EXAMPLE 3

Bis[4-(3-aminophenoxy)phenyl]sulfone, weighing 66.12 parts by weight, was introduced into a 500 ml separable flask to which 370 parts by weight of dewatered N-methylpyrrolidone was subsequently added. After an interior of the flask was replaced by nitrogen, the flask contents were stirred at 150 rpm for about 30 minutes. Next, 33.72 parts by weight of pyromellitic anhydride and 40 parts by weight of dewatered N-methylpyrrolidone were added to the flask contents which were subsequently stirred at 150 rpm for 1 hour. Then, 253.2 parts by weight of an N-methylpyrrolidone solution containing 7.9% synthetic hectorite (product of CO-OP Chemical Co., Ltd., LUCENTITE STN), 0.001 parts by weight of aniline and 40 parts by weight of dewatered N-methylpyrrolidone were added to the flask contents which were subsequently stirred at 600 rpm for 4 hours to obtain a clay-containing polyamic acid solution. The obtained polyamic acid solution was heated to a high temperature so that a most part of a solvent volatilized and formed into a film. Thereafter, the film was heated to a further higher temperature to continue a reaction and effect imidation. As a result, a master batch of clay-containing polyimide was obtained. Next, 100 parts by weight of a thermoplastic resin "AURUM PD-450" (product of Mitsui Chemicals, Inc.) and 43 parts by weight of the above-obtained masterbatch were fed into a compact-size extruder (product of Japan Steel Works, Ltd., TEX-30), melt kneaded at 420° C. under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 400° C. to prepare 2 mm and 100 μm thick plates.

EXAMPLE 4

1,3-bis(4-aminophenoxy)benzene (product of Wako Pure Chem. Industries, Ltd.), weighing 47.24 parts by weight, was introduced into a 500 ml separable flask to which 370 parts by weight of dewatered N-methylpyrrolidone (product of Wako Pure Chem. Industries, Ltd.) was subsequently added. After an interior of the flask was replaced by nitrogen, the flask contents were stirred at 150 rpm for about 30 minutes. Then, 52.60 parts by weight of 3,3',4,4'-benzophenonetetra-carboxylic dianhydride (product of Daicel Chem. Industries, Ltd.) and 40 parts by weight of dewatered N-methylpyrrolidone were added to the flask contents which were subsequently stirred at 150 rpm for 1 hour. Then, 253.2 parts by weight of an N-methylpyrrolidone solution containing 3.9% synthetic mica (synthetic mica chemically treated with 1,2-dimethyl-3-N-decyl-imidazolium), 0.002 parts by weight of aniline (product of Wako Pure Chem. Industries, Ltd.) and 40 parts by weight of dewatered N-methylpyrrolidone were added to the flask contents which were subsequently stirred at 600 rpm for 4 hours to obtain a clay-containing polyamic acid solution. A solvent was dried out from the obtained polyamic acid solution which was then imidated to obtain a masterbatch of clay-containing polyimide. Next, 100 parts by weight of AURUM (product of Mitsui Chemicals, Inc., PD-450) as a thermoplastic resin and 25 parts by weight of the above-obtained masterbatch were fed into a compact-size extruder (product of Japan Steel Works, Ltd., TEX-30), melt kneaded at 420 C under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 400° C. to prepare 2 mm and 100 μm thick plates of the resin composition.

EXAMPLE 5

Bis[4-(3-aminophenoxy)phenyl]sulfone, weighing 66.12 parts by weight, was introduced into a 500 ml separable flask to which 370 parts by weight of dewatered dimethylformaldehyde (DMF) was subsequently added. After an interior of the flask was replaced by nitrogen, the flask contents were stirred at 150 rpm for about 30 minutes. Then, 33.72 parts by weight of pyromellitic anhydride and 40 parts by weight of dewatered dimethylformaldehyde (DMF) were added to the flask contents which were subsequently stirred at 150 rpm for 1 hour. Then, 253.2 parts by weight of a DMF solution containing 7.9% synthetic hectorite (product of CO-OP Chemical Co., Ltd., LUCENTITE STN), 0.001 parts by weight of aniline and 40 parts by weight of dewatered DMF were added to the flask contents which were subsequently stirred at 600 rpm for 4 hours to obtain a clay-containing polyamic acid solution.

A solvent was dried out from the obtained polyamic acid solution which was then imidated to obtain a masterbatch of clay-containing polyimide. Next, 100 parts by weight of AURUM (product of Mitsui Chemicals, Inc., PD-450) as a thermoplastic resin, 17.6 parts by weight of the above-obtained masterbatch and 10 parts by weight of aluminum borate whisker (product of Shikoku Chemicals Corp.) were fed into a compact-size extruder (product of Japan Steel Works, Ltd., TEX-30), melt kneaded at 420° C. under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 400° C. to prepare 2 mm and 100 μm thick plates.

EXAMPLE 6

1,3-bis(4-aminophenoxy)benzene (product of Wako Pure Chem. Industries, Ltd.), weighing 47.24 parts by weight, was introduced into a 500 ml separable flask to which 370 parts by weight of dewatered N-methylpyrrolidone (NMP) was subsequently added. After an interior of the flask was replaced by nitrogen, the flask contents were stirred at 150 rpm for about 30 minutes. Then, 52.60 parts by weight of 3,3',4,4'-benzophenonetetra-carboxylic dianhydride and 40 parts by weight of dewatered NMP were added to the flask contents which were subsequently stirred at 150 rpm for 1 hour. Subsequently, 253.2 parts by weight of an NMP solution containing 3.9% syntheticmica (product of CO-OP Chemical Co., Ltd., SOMASIF MPE), 0.002 parts by weight of aniline and 40 parts by weight of dewatered NMP were added to the flask contents which were subsequently stirred at 600 rpm for 4 hours to obtain a clay-containing polyamic acid solution.

A solvent was dried out from the obtained polyamic acid solution which was then imidated to obtain a masterbatch of clay-containing polyimide. Next, 100 parts by weight of AURUM (product of Mitsui Chemicals, Inc., PD-450) as a thermoplastic resin, 25 parts by weight of the above-obtained masterbatch and 8 parts by weight of carbon silicate whisker (product of Toyo Carbon Co., Ltd.) were fed into a compact-size extruder (product of Japan Steel Works, Ltd., TEX-30), melt kneaded at 420° C. under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 400° C. to prepare 2 mm and 100 μm thick plates.

EXAMPLE 7

100 parts by weight of AURUM (product of Mitsui Chemicals, Inc., PD-450) as a thermoplastic resin, and 3 parts by weight of synthetic mica (product of CO-OP Chemical Co., Ltd., SOMASIF MPE) were fed into a compact-size extruder (product of Japan Steel Works, Ltd., TEX-30), melt kneaded at 330° C. under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 340° C. to prepare 2 mm and 100 μm thick plates.

EXAMPLE 8

100 parts by weight of AURUM (product of Mitsui Chemicals, Inc., PD-450) as a thermoplastic resin, 3 parts by weight of synthetic mica (synthetic mica chemically treated with 1,2-dimethyl-3-N-decyl-imidazolium) and 15 parts by weight of silica (product of Admatechs Co., Ltd., SO-E5) were fed into a compact-size extruder (product of Japan Steel Works, Ltd., TEX-30), melt kneaded at 420° C. under a stream of nitrogen and extruded into strands which were subsequently pelletized by a pelletizer to provide pellets of the resin composition. The obtained pellets of the resin composition were placed under a stream of nitrogen and then heat pressed between upper and lower rolls both controlled at 400° C. to prepare 2 mm and 100 μm thick plates.

EXAMPLE 9

Isobornyl acrylate, weighing 92.3 g, was introduced into a 500 ml separable flask to which 77.0 g of a dimethylformamide solution (DMF) solution containing 10 wt. % of synthetic hectorite (product of CO-OP Chemical Co., Ltd., LUCENTITE STN) was added. The flask contents were stirred for 1 hour to obtain a clay-containing isobornyl acrylate solution. Subsequently, the obtained clay-containing isobornyl acrylate solution was placed under a stream of 80° C. oven-air to distill DMF off and obtain clay-containing isobornyl acrylate. Then, 0.9 g of a photopolymerization initiator (product of Ciba Specialty Chemicals Corp., IRGACURE 651) was added to and mixed with the clay-containing isobornyl acrylate to homogeneity. The mixture was exposed for 10 minutes to a 365 nm ultraviolet radiation at an intensity of 1 mW/cm$^2$ and heat pressed at 160 C to prepare 2 mm and 100 μm thick plates of the resin composition.

EXAMPLE 10

Methyl methacrylate, weighing 92.3 g, was introduced into a 1,000 ml flask to which 77.0 g of a methyl ethyl ketone (MEK) solution containing 10 wt. % synthetic hectorite (product of CO-OP Chemical Co., Ltd., LUCENTITE STN) and 200 g of MEK were added. The flask contents were stirred while maintained at 80° C. by a hot bath. Meanwhile, 2.5 g of azoisobutyronitrile (AIBN) and 100 ml MEK were mixed to prepare an AIBN solution. To the flask contents while stirred and maintained at 80° C. by a hot bath, this AIBN solution was added by five times, 20 ml at a time, at intervals of 1 hour. After addition of the final part, the flask contents were further maintained at 80° C. for additional two hours. The resulting reaction product was dried under reduced pressure and heat to remove MEK, and then heat pressed at 160° C. to prepare 2 mm and 100 μm thick plates of the resin composition.

COMPARATIVE EXAMPLE 1

The procedure of Example 1 was followed, except that the swelling fluorine mica (product of CO-OP Chemical Co., Ltd., SOMASIF MAE-100) was excluded, to prepare a resin composition and 2 mm and 100 μm thick plates of the resin composition.

COMPARATIVE EXAMPLE 2

The procedure of Example 2 was followed, except that the swelling fluorine mica (product of CO-OP Chemical Co., Ltd., SOMASIF MAE-100) was excluded, to prepare a resin composition and 2 mm and 100 μm thick plates of the resin composition.

COMPARATIVE EXAMPLE 3

The procedure of Example 3 was followed, except that the synthetic hectorite (product of CO-OP Chemical Co., Ltd., LUCENTITE STN) was excluded, to prepare a resin composition and 2 mm and 100 μm thick plates of the resin composition.

COMPARATIVE EXAMPLE 4

The procedure of Example 4 was followed, except that the synthetic mica (synthetic mica chemically treated with 1,2-dimethyl-3-N-decyl-imidazolium) was excluded, to prepare a resin composition and 2 mm and 100 μm thick plates of the resin composition.

COMPARATIVE EXAMPLE 5

The procedure of Example 5 was followed, except that the synthetic hectorite (product of CO-OP Chemical Co., Ltd., LUCENTITE STN) was excluded, to prepare a resin composition and 2 mm and 100 μm thick plates of the resin composition.

COMPARATIVE EXAMPLE 6

The procedure of Example 6 was followed, except that the synthetic mica (product of CO-OP Chemical Co., Ltd., SOMASIF MPE) was excluded, to prepare a resin composition and 2 mm and 100 μm thick plates of the resin composition.

COMPARATIVE EXAMPLE 7

The procedure of Example 7 was followed, except that the synthetic mica (product of CO-OP Chemical Co., Ltd., SOMASIF MPE) was excluded, to prepare a resin composition and 2 mm and 100 μm thick plates of the resin composition.

COMPARATIVE EXAMPLE 8

The procedure of Example 8 was followed, except that the synthetic mica (synthetic mica chemically treated with 1,2-dimethyl-3-N-decyl-imidazolium) was excluded, to prepare a resin composition and 2 mm and 100 μm thick plates of the resin composition.

COMPARATIVE EXAMPLE 9

The procedure of Example 8 was followed, except that the loading of the silica (product of Admatechs Co., Ltd., SO-E5) was changed to 60 parts by weight and the syntheticmica (synthetic mica chemically treated with 1,2-dimethyl-3-N-decyl-imidazolium) was excluded, to prepare a resin composition and 2 mm and 100 μm thick plates of the resin composition.

COMPARATIVE EXAMPLE 10

92.3 g of isobornyl acrylate and 0.9 g of a photo-polymerization initiator (product of Ciba Specialty Chemicals Corp., IRGACURE 651) were mixed to homogeneity. The mixture was exposed for 10 minutes to a 365 nm ultraviolet radiation at an intensity of 1 mW/cm² and heat pressed at 160° C. to prepare 2 mm and 100 μm thick plates of the resin composition.

Evaluation

The plates prepared in Examples 1-10 and Comparative Examples 1-10 were evaluated for below-itemized performance. Those prepared in Examples 5 and 6 and Comparative Examples 5 and 6 were also evaluated for elastic modulus. The results are given in Tables 1 and 2.

(1) Measurement of Thermal Expansion Coefficient

Each plate was cut into a 3 mm×25 mm size to provide a test piece. The test piece was heated at a rate of 5° C./min using a TMA (thermomechanical analysis) instrument (product of Seiko Instruments, Inc., TMA/SS120C) and measured for mean linear expansion coefficient (maybe hereinafter referred to as "CTE") and evaluated for the following items:

Mean linear expansion coefficient ($\alpha 2$) [$° C.^{-1}$] over a temperature range 10° C.-50° C. higher than a glass transition temperature of the resin composition;

Mean linear expansion coefficient ratio ($\alpha 2/\alpha 1$) determined by dividing the mean linear expansion coefficient ($\alpha 2$) over the temperature range 10° C.-50° C. higher than a glass transition temperature of the resin composition by a mean linear expansion coefficient ($\alpha 1$) at a temperature range 10° C.-50° C. lower than the glass transition temperature of the resin composition;

Mean linear expansion coefficient [$° C.^{-1}$] over the 50° C.-100° C. temperature range and mean linear expansion coefficient [$° C.^{-1}$] over the 200° C.-240° C. temperature range;

Mean linear expansion coefficient ratio (1) determined by dividing the mean linear expansion coefficient over the 50° C.-100° C. temperature range by the mean linear expansion coefficient over the 200° C.-240° C. temperature range, as well as mean linear expansion coefficient ratio (2) determined by dividing the mean linear expansion coefficient over the 250° C.-300° C. temperature range by the mean linear expansion coefficient over the 50° C.-100° C. temperature range;

Change rate (%) determined by dividing a change in length of a test piece when increased in temperature from 25° C. to 300° C. by a length of the test piece at 25° C.;

Mean linear expansion coefficient ratio (3) represented by the preceding equation (1); and Improvement factor determined by dividing a mean linear expansion coefficient over the temperature 10° C.-50° C. higher than a Tg of the resin composition of each Example by a mean linear expansion coefficient over the temperature 10°

C.-50° C. higher than a Tg of the resin composition prepared in the corresponding Comparative Example.

(2) Mean Interlayer Spacing of Layer Silicate

For each 2 mm thick plate, 2θ at diffraction peaks was measured from diffraction of an X-ray on a surface of a layer silicate salt that extended along a plane of lamination, using an X-ray diffraction measurement instrument (product of Rigaku Industrial Corp., RINT 1100). The separation d of the (001) planes of the layer silicate was calculated from the following Bragg's diffraction equation (5). The obtained value for d was taken as a mean interlayer spacing (nm).

$$\lambda = 2d \sin\theta \qquad \text{Equation (5)}$$

In the equation (5), λ is 0.154 and θ represents a diffraction angle.

(3) Proportion of a Layer Silicate that is Dispersed in the Form of a Stack Consisting of 5 or Less Layers Each 100 μm thick plate was observed by a transmission electron microscope at a magnification of 100,000 to measure a total number X of layers of the layer silicate observable in a particular area, as well as a number Y of layers of the layer silicate dispersed in the form of a stack consisting of 5 or less layers. The proportion of the layer silicate that is dispersed in the form of a stack consisting of 5 or less layers was calculated from the following equation (4):

$$\text{Proportion (\%) of layer silicate that is dispersed in the form of a stack consisting of 5 or less layers} = (Y/X) \times 100 \qquad \text{Equation (4)}$$

(4) Water Absorbency Measurement

Each 100 μm thick plate was cut to a 3×5 cm strip to provide a test piece. The test piece was dried at 80° C. for 5 hours and then its weight W1 was measured. Next, the test piece was soaked with water, left to stand under 25° C. atmosphere for 24 hours and carefully wiped at its surface using a waste cloth. Thereafter, its weight W2 was measured. The water absorbency was calculated from the following equation:

$$\text{Water absorbency(\%)} = (W2-W1)/W1 \times 100$$

(5) Measurement of Linear Humidity Expansion Coefficient

Each 100 μm thick plate was placed in a thermo-hygrostat at 50° C. and 30% RH for 24 hours and then its dimension (L1) was measured. Next, the plate was placed in a thermo-hygrostat at 50° C. and 80% RH for 24 hours and then its dimension (L2) was measured. The linear humidity expansion coefficient was calculated from the following equation:

$$\text{Linear humidity expansion coefficient } [\% RH^{-1}] = (L2-L1)/L1/(80-30)$$

(6) Measurement of Dielectric Constant

The dielectric constant at a frequency around 1 MHz was measured using an impedance measurement instrument (product of HP Company, HP 4291B).

(7) Measurement of Solubility Parameter

The solubility parameter was calculated using a Fedors equation.

(8) Measurement of 10% Weight Loss Temperature

A sample, weighing 5-10 mg, was dried at 150° C. for 5 hours and then measured using a TG/DTA instrument (Seiko Instruments, Inc.) under the following measurement conditions:

Measurement temperature: 25-600° C.;
Heating rate: 10° C./min; and
Nitrogen gas: 200 ml/min.

TABLE 1

| | Tg (° C.) | α2 ×10$^{-4}$(° C.$^{-1}$) | α2/α1 | 50-100° C. CTE ×10$^{-5}$(° C.$^{-1}$) | 200-240° C. CTE ×10$^{-5}$(° C.$^{-1}$) | Mean Linear Expansion Coefficient Ratio (1) | Mean Linear Expansion Coefficient Ratio (2) | Change Rate (%) | Mean Linear Expansion Coefficient Ratio (3) | Improvement Factor |
|---|---|---|---|---|---|---|---|---|---|---|
| Ex. 1 | 255 | 8.2 | 9.8 | 4.4 | 6.3 | 1.15 | 2.77 | 6.0 | 1.43 | 0.11 |
| Ex. 2 | 185 | 8.7 | 12.3 | 2.7 | 7< | — | 12.52 | 7.0 | 1.39 | 0.12 |
| Ex. 3 | 262 | 7.3 | 6.5 | 4.4 | 7.0 | 1.31 | 8.43 | 4.3 | 1.37 | 0.10 |
| Ex. 4 | 240 | 5.7 | 6.3 | 4.2 | — | 1.14 | 9.12 | 4.8 | 1.29 | 0.40 |
| Ex. 5 | 251 | 7.9 | 5.9 | 4.0 | 6.9 | 1.30 | 8.13 | 4.0 | 1.35 | 0.10 |
| Ex. 6 | 239 | 5.2 | 6.1 | 4.3 | — | 1.49 | 9.24 | 5.3 | 1.26 | 0.39 |
| Ex. 7 | 238 | 9.8 | 14.5 | 4.1 | — | 1.64 | 18.31 | 7.0 | 1.45 | 0.41 |
| Ex. 8 | 259 | 9.2 | 14.1 | 3.5 | 6.1 | 1.21 | 16.93 | 6.5 | 1.41 | 0.38 |
| Ex. 9 | 99 | 0.77 | 1.8 | 4.5 | — | 2.00 | — | — | 1.9 | 0.37 |
| Ex. 10 | 109 | 0.69 | 1.6 | 4.3 | — | 1.90 | — | — | 1.7 | 0.25 |
| Comp. Ex. 1 | 252 | 30< | 70< | 4.9 | 7< | 1.69 | 20< | 7< | 1.5< | — |
| Comp. Ex. 2 | 190 | 30< | 70< | 3.1 | 7< | 2.0< | 20< | 7< | 1.5< | — |
| Comp. Ex. 3 | 254 | 30< | 70< | 5.6 | 7< | 1.85 | 20< | 7< | 1.5< | — |
| Comp. Ex. 4 | 233 | 30< | 70< | 5.4 | — | 2.0< | 20< | 7< | 1.5< | — |
| Comp. Ex. 5 | 245 | 30< | 70< | 4.9 | 7< | 1.76 | 20< | 7< | 1.5< | 0.99 |
| Comp. Ex. 6 | 234 | 30< | 70< | 4.8 | — | 2.0< | 20< | 7< | 1.5< | 0.99 |
| Comp. Ex. 7 | 230 | 30< | 70< | 6.8 | — | 2.0< | 20< | 7< | 1.5< | — |
| Comp. Ex. 8 | 251 | 30< | 70< | 5.2 | 7< | 1.78 | 20< | 7< | 1.5< | 1.00 |
| Comp. Ex. 9 | 250 | 30< | 70< | 4.6 | — | 1.45 | 20< | 7< | 1.5< | 0.98 |
| Comp. Ex. 10 | 93 | 30< | 70< | 9 | — | 2< | 20< | 7< | 1.5< | — |

TABLE 2

| | Water Absorbency (%) | Linear Humidity Expansion Coefficient ×10⁻⁵(% RH⁻¹) | Dielectric Constant (1 MHz) Before Moisture Absorption | Dielectric Constant (1 MHz) After Moisture Absorption | Inorganic Compound Mean Inter layer Spacing (nm) | *1) | Elastic Modulus GPa | Solubility Parameter [J/cm³]^(1/2) | 10% Weight Loss Temperature °C. |
|---|---|---|---|---|---|---|---|---|---|
| Ex. 1 | 0.9 | 1.2 | 3.2 | 3.3 | 3.5< | 10< | — | 57.3 | 400< |
| Ex. 2 | 0.5 | 1.1 | 3.3 | 3.3 | 3.5< | 10< | — | 51.0 | 400< |
| Ex. 3 | 0.8 | 1.1 | 3.2 | 3.2 | 3.5< | 10< | — | — | 400< |
| Ex. 4 | 0.8 | 1.3 | 3.2 | 3.2 | 3.5< | 10< | — | 60.7 | 400< |
| Ex. 5 | 0.7 | 1.1 | 3.2 | 3.2 | 3.5< | 10< | 6.2 | — | 400< |
| Ex. 6 | 0.7 | 1.2 | 3.2 | 3.2 | 3.5< | 10< | 6.4 | 60.7 | 400< |
| Ex. 7 | 0.7 | 1.2 | 3.2 | 3.2 | 3.5< | 10< | — | — | 400< |
| Ex. 8 | 0.5 | 1.0 | 3.2 | 3.2 | 3.5< | 10< | — | — | 400< |
| Ex. 9 | 0.4 | 0.6 | — | — | 3.5< | 10< | — | — | — |
| Ex. 10 | 0.4 | 0.6 | — | — | 3.5< | 10< | — | — | — |
| Comp. Ex. 1 | 1.2 | 1.6 | 3.3 | 3.5 | — | — | — | 57.3 | 400< |
| Comp. Ex. 2 | 0.7 | 1.6 | 3.4 | 3.5 | — | — | — | 51 | 400< |
| Comp. Ex. 3 | 1.2 | 1.7 | 3.3 | 3.5 | — | — | — | — | 400< |
| Comp. Ex. 4 | 1.2 | 1.6 | 3.3 | 3.5 | — | — | — | 60.7 | 400< |
| Comp. Ex. 5 | 1.1 | 1.6 | 3.3 | 3.4 | — | — | 4.4 | — | 400< |
| Comp. Ex. 6 | 1.1 | 1.6 | 3.3 | 3.4 | — | — | 4.1 | 60.7 | 400< |
| Comp. Ex. 7 | 1.3 | 1.6 | 3.3 | 3.5 | — | — | — | — | 400< |
| Comp. Ex. 8 | 1.2 | 1.6 | 3.3 | 3.4 | — | — | — | — | 400< |
| Comp. Ex. 9 | 1.0 | 1.4 | 3.4 | 3.4 | — | — | — | — | 400< |
| Comp. Ex. 10 | 0.5 | 0.7 | — | — | — | — | — | — | — |

*1) Proportion of the Organic Compound that is Dispersed in the Form of a Stack Consisting of 5 or Less Layers (%)

UTILITY IN INDUSTRY

In accordance with the present invention, a resin composition, substrate material, sheet, laminated board, resin-bearing copper foil, copper-clad laminate, TAB tape, printed circuit board, prepreg, adhesive sheet and optical circuit forming material can be provided which exhibit improved physical properties, dimensional stability, heat resistance and flame retardance, particularly high-temperature physical properties.

The invention claimed is:

1. A resin composition for an electronic material or for use in formation of an optical circuit containing:
   100 parts by weight of a thermoplastic resin; and
   0.1-65 parts by weight of an inorganic compound comprising a layer silicate and at least one of whisker and silica, said layer silicate being dispersed in the resin composition such that it has a mean interlayer spacing of at least 3 nm along the (001) plane, when measured by a wide-angle X-ray diffraction measurement method, and a part or all of stacks consists of 5 or less layers,
   wherein said resin composition has a mean linear expansion coefficient ($\alpha 2$) of $3.0 \times 10^{-3}$ (° C.$^{-1}$) or below over the temperature range from a temperature 10 °C. higher than a glass transition temperature of the resin composition to a temperature 50° C. higher than the glass transition temperature of the resin composition, and a mean linear expansion coefficient ratio ($\alpha 2/\alpha 1$) of up to 70, where said mean linear expansion coefficient ratio is calculated by dividing the mean linear expansion coefficient ($\alpha 2$) over the temperature range from a temperature 10° C. higher than a glass transition temperature of the resin composition to a temperature 50° C. higher than the glass transition temperature of the resin composition by a mean linear expansion coefficient ($\alpha 1$) over the temperature range from a temperature 50° C. lower than the glass transition temperature of the resin composition to a temperature 10° C. lower than the glass transition temperature of the resin composition. ($\alpha 2$) of $3.0 \times 10^{-3}$ (° C.$^{-1}$) or below over the temperature range from a temperature 10° C. higher than a glass transition temperature of the resin composition to a temperature 50° C. higher than the glass transition temperature of the resin composition.

2. The resin composition as recited in claim 1, characterized in that said mean linear expansion coefficient ($\alpha 2$) is $1.0 \times 10^{-3}$ (° C.$^{-1}$) or below over the temperature range from a temperature 10° higher than a glass transition temperature of the resin composition to a temperature 50° C. higher than the glass transition temperature of the resin composition.

3. The resin composition as recited in claim 1, characterized as having a mean linear expansion coefficient ratio ($\alpha 2/\alpha 1$) of up to 15, where said mean linear expansion coefficient ratio is calculated by dividing the mean linear expansion coefficient ($\alpha 2$) over the temperature range from a temperature 10° C. higher than a glass transition temperature of the resin composition to a temperature 50° C. higher than the glass transition temperature of the resin composition by a mean linear expansion coefficient ($\alpha 1$) over the temperature range from a temperature 50° C. lower than the glass transition temperature of the resin composition to a temperature 10° C. lower than the glass transition temperature of the resin composition.

4. The resin composition as recited in claim 1, characterized as having a mean linear expansion coefficient which does not exceed $4.5 \times 10^{-5}$ (° C.$^{-1}$) over the 50-100° C. temperature range and which does not exceed $7 \times 10^{-5}$ (° C.$^{-1}$) over the 200-240° C. temperature range.

5. The resin composition as recited in claim 1, characterized as having a mean linear expansion coefficient ratio (1) of up to 2.0 and a mean linear expansion coefficient ratio (2) of up to 20, where the former ratio is calculated by dividing a mean linear expansion coefficient over the 150-200 ° C. temperature range by the mean linear expansion coefficient over the 50-100 °C. temperature range and the latter ratio is calculated by dividing a mean linear expansion coefficient over the 250-300° C. temperature range by the mean linear expansion coefficient over the 50-100° C. temperature range.

6. The resin composition as recited in claim 1, characterized as having a rate of change of up to 7%, where the rate of change is calculated by dividing a change in length of a resin piece comprised of the resin composition when heated from 25° C. to 300° C. by a length of said resin piece at 25° C.

7. The resin composition as recited in claim 1, characterized as having a value of up to 1.5 for a mean linear expansion coefficient ratio (3) as determined by the following equation (1):

mean linear expansion coefficient ratio (3)=mean linear expansion coefficient over the $(\alpha+40)-(\alpha+60)°$ C. range/ mean linear expansion coefficient over the $\alpha-(\alpha+20)°$ C. range equation (1);

where $\alpha(°$ C.) is between 50° C. and 400° C. and the cases where the mean linear expansion coefficient ratio (3) is determined over a range across Tg are excluded.

8. The resin composition as recited in claim 1, characterized as having an improvement factor of up to 0.50, wherein the improvement factor is determined by dividing the mean linear expansion coefficient over the temperature range from a temperature 10 ° C. higher than the glass transition temperature of the resin, composition to a temperature 50° C. higher than the glass transition temperature of the resin composition by a mean linear expansion coefficient over to temperature range from a temperature 10° C. higher than a glass transition temperature of said resin to a temperature 50° C. higher than the glass transition temperature of the resin.

9. The resin composition as recited in claim 1, characterized as having a tensile modulus of 6 GPa or above and a dielectric constant at 1 MHz of 3.3 or below.

10. The resin composition as recited in claim 1, characterized as having a water absorbency of 1.0% or below and a liner humidity expansion coefficient of up to $1.5 \times 10^{-5}$ (% $RH^{-1}$).

11. The resin composition as recited in claim 1, characterized as having a water absorbency of 1.0% or below, a dielectric constant at 1 MHz of up to 3.3 and a dielectric constant after water absorption of up to 3.4.

12. The resin composition as recited in claim 1, characterized as having a glass transition temperature of 100° C. or above.

13. The resin composition as recited in claim 1, characterized in that said thermoplastic resin has a glass transition temperature of 100° C. or above and a dielectric constant at 1 MHz of up to 3.3.

14. The resin composition as recited in claim 1, characterized in that said thermoplastic resin is at least one selected from to group consisting of polyphenylene ether resins, mixtures of polystyrene resins with polyphenylene ether resins or with functionally modified polyphenylene ether resins, alicyclic hydrocarbonresins, thermoplastic polyimide resins, polyether ether ketone resins, polyester imide resins, polyether imide resins and thermoplastic polybenzoimidazole resins.

15. The resin composition as recited in claim 1, characterized in that said thermoplastic resin has a solubility parameter of 42 $(J/cm^3)^{1/2}$ or above, when calculated using a Fedors equation.

16. The resin composition as recited in claim 1, characterized in that said thermoplastic resin exhibits a 10% weight loss temperature of 400° C. or above, based on its weight at 25° C., in the thermogravimetric measurement under the nitrogen atmosphere.

17. The resin composition recited in claim 1, further comprising at least one of whisker and silica as said inorganic compound.

18. The resin composition as recited in claim 1, characterized in that said layer silicate is at least one selected from the group consisting of montmorillonite, hectorite, swelling mica and vermiculite.

19. The resin composition as recited in claim 1, characterized in that said layer silicate contains an alkyl ammonium ion having 6 or more carbon atoms in the alkyl, aromatic quaternary ammonium ion or heterocyclic quaternary ammonium ion.

20. A substrate material characterized as using the resin composition as recited in claim 1.

21. A sheet characterized as using the resin composition as recited in claim 1.

22. A laminated board characterized as using the resin composition as recited in claim 1.

23. A resin-bearing copper foil characterized as using the resin composition as recited in claim 1.

24. A copper-clad laminate characterized as using the resin composition as recited in claim 1.

25. A TAB tape characterized as using the resin composition as recited in claim 1.

26. A printed circuit board characterized as using the resin composition as recited in claim 1.

27. A prepreg characterized as using the resin composition as recited in claim 1.

28. An adhesive sheet characterized as using the resin composition as recited in claim 1.

29. An optical circuit forming material characterized as using the resin composition as recited in claim 1.

30. The resin composition as recited in claim 17, wherein said inorganic compound comprises the layer silicate and whisker and the amount of the whisker is 25 -95 by weight % based on 100% by weight of the inorganic compound.

31. The resin composition as recited in claim 17, wherein said inorganic compound comprises the layer silicate and silica and the amount of the silica is 25-95 by weight % based on 100% by weight of the inorganic compound.

* * * * *